United States Patent
Kuttner

(10) Patent No.: US 7,307,567 B2
(45) Date of Patent: Dec. 11, 2007

(54) DIGITAL-ANALOG CONVERTER AND DIGITAL-ANALOG CONVERSION METHOD

(75) Inventor: Franz Kuttner, St. Ulrich (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/564,312

(22) PCT Filed: Jul. 7, 2004

(86) PCT No.: PCT/EP2004/007428

§ 371 (c)(1),
(2), (4) Date: Jun. 30, 2006

(87) PCT Pub. No.: WO2005/006560

PCT Pub. Date: Jan. 20, 2005

(65) Prior Publication Data

US 2007/0046518 A1    Mar. 1, 2007

(30) Foreign Application Priority Data

Jul. 11, 2003  (DE) ................. 103 31 545

(51) Int. Cl.
*H03M 1/66* (2006.01)
(52) U.S. Cl. .................. 341/144; 341/136; 341/153
(58) Field of Classification Search ................ 341/136, 341/153
See application file for complete search history.

(56) References Cited

U.S. PATENT DOCUMENTS

| | | | |
|---|---|---|---|
| 4,910,514 A | | 3/1990 | Irmer et al. |
| 5,453,743 A | * | 9/1995 | Kang ................ 341/144 |
| 5,539,405 A | | 7/1996 | Norsworthy |
| 5,844,515 A | * | 12/1998 | Park ................. 341/144 |
| 6,160,507 A | | 12/2000 | Carbou et al. |
| 6,163,283 A | * | 12/2000 | Schofield ............ 341/50 |
| 6,232,903 B1 | * | 5/2001 | Koifman et al. ....... 341/144 |
| 6,236,346 B1 | | 5/2001 | Schofield et al. |
| 6,426,715 B1 | | 7/2002 | Westra et al. |

(Continued)

FOREIGN PATENT DOCUMENTS

EP    0 176 981    5/2001

OTHER PUBLICATIONS

Geerts, Yves et al. "Multibit Delta-Sigma A/D Converters." Kluwer Academic Publisher. pp. 74-97. (27 Pages), no month or date.

*Primary Examiner*—Khai M. Nguyen
(74) *Attorney, Agent, or Firm*—Maginot, Moore & Beck

(57) ABSTRACT

The present invention provides a digital-analog converter having: a DEM logic device (10) for generating at least two digital output data items (13, 14) from the digital input data (11) on the basis of a predetermined algorithm to determine an initial cell and a final cell in the array arrangement (22), between which there are situated cells (24) with energy sources (30) to be activated; a decoder device (16) for decoding the at least two digital output data items (13, 14) from the DEM device (10) into actuation signals (17, 17', 18, 18', 19, 19' 20, 20', 21, 21') in order to activate the cells (24) which are to be activated; and an array arrangement (22) of cells (23) for outputting at least one quantized analog signal (25, 25') on the basis of the actuation signals (17, 17', 18, 18', 19, 19' 20, 20', 21, 21'). The present invention likewise provides a method for digital-analog conversion.

20 Claims, 5 Drawing Sheets

U.S. PATENT DOCUMENTS 6,456,218 B1    9/2002  Dedic et al.
6,559,785 B2 *  5/2003  Kuttner ..................... 341/155
6,650,266 B1 *  11/2003  Tester ........................ 341/144
6,768,439 B2 *  7/2004  Sun ............................ 341/144

* cited by examiner

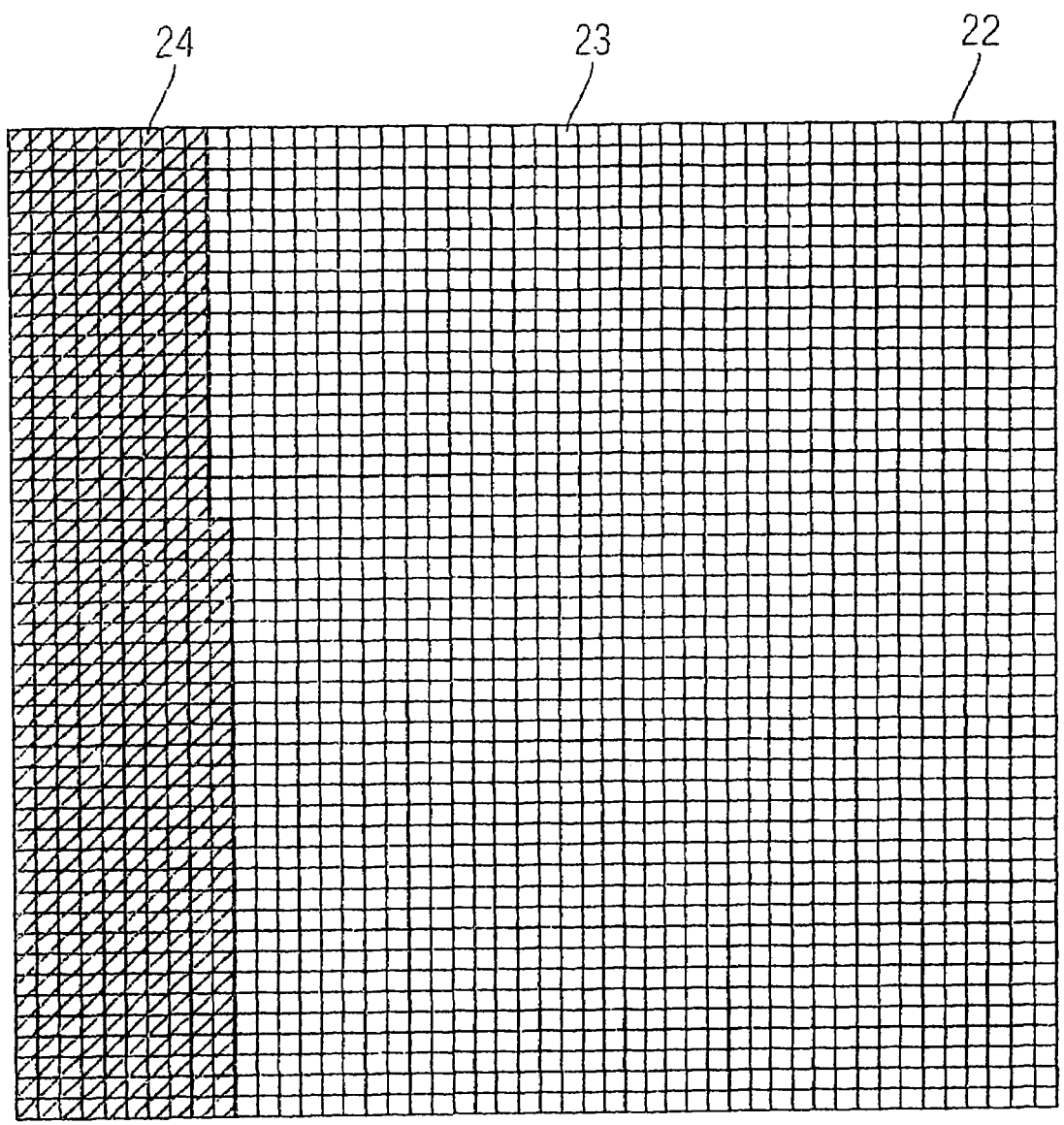

DIGITAL-ANALOG CONVERTER AND DIGITAL-ANALOG CONVERSION METHOD

CROSS-REFERENCE TO RELATED APPLICATION

This application is a 371 national stage of International Application No. PCT/EP04/07428, filed Jul. 7, 2004, which designated the United States, the contents of which are incorporated herein by reference in their entirety.

FIELD OF THE INVENTION

The present invention relates to a digital-analog converter and to a method for digital-analog conversion, and particularly to a D/A converter with an array arrangement for current cells using DEM (Dynamic Element Matching) and to a corresponding conversion method.

BACKGROUND

D/A converters are today used in a wide range of applications. In such applications, a quantized analog signal must always be produced from a digital signal using a quantization device. The usual problem in this context is that the quantization device, which often comprises a multiplicity of quantization elements, cannot ensure an arbitrarily high level of accuracy for the quantized analog output signal.

To overcome the problem of inaccurate or imprecise quantization elements in D/A converters, it is known practice to use DEM (Dynamic Element Matching), as described in "Design of Multibit Delta-Sigma A/D converters" by Yves Geerts, Michael Steyaert, Willy Sansen, Kluwer Academic Publisher, ISBN 1-4020-7078-0, on pages 74 to 97. A drawback of using DEM is that D/A converters with high resolution, i.e. with a large number of quantization elements in the quantization device, require very complex hardware for this.

High-resolution D/A converters are therefore known to be preferably provided as an array arrangement of current sources, as described in European patent specification EP 0 176 981. FIG. 5 shows an example of how the current sources for the individual cells 23 in the array arrangement 22 are connected in a conventional D/A converter, formed from a current source array arrangement 22. In this case, a predetermined number of single cells 24 is activated, i.e. the current sources in the single cells are turned on, starting from a first cell in the top left-hand corner of the array arrangement 22 in line with a digital input signal. The individual currents from the current sources of the single cells are added at the output to form a current signal at a corresponding level. The level can essentially be calculated from the number of activated single cells times the current value for each single cell, which is assumed to be the same.

First, the drawback arises that the cells 23 in the initial region, starting at the first cell at the top left, are used very much more or more frequently than the cells 23 in the final region, particularly the last cell 23 in the array arrangement 22 at the bottom left. Another drawback is that each single cell 23 in practice does not deliver an exactly identical output current, such as the adjacent activated cell 24. As a result, a quantization error arises which corrupts or distorts the quantized analog current output signal from the array arrangement 22. The quantization error for the initial cells 23, starting at the first cell at the top left, is then included in the output signal again and again.

It is therefore an object of the present invention to provide a D/A converter which generates a small quantization error at a high resolution. The invention achieves this object by means of a digital-analog converter and by means of a method for digital-analog conversion in accordance with embodiments of the invention.

The idea on which the present invention is based essentially involves combining a DEM device with a high-resolution D/A converter which has an array arrangement comprising cells, preferably with current sources. This allows the area or a cohesive block of the energy sources, preferably current sources, which are turned on to be connected to any point in the array arrangement. It is thus possible for the cells in the array arrangement and hence the individual, normally imprecise, energy sources to be interchanged dynamically. In addition, each energy source, preferably current source, for the cells in the array arrangement will accordingly be turned on with the same frequency, as a result of which essentially a random spread of the individual quantization errors of a single cell is achieved in the influence on the quantized analog output signal.

The present invention solves the problem cited at the outset particularly by providing a D/A converter having: a DEM logic device for generating at least two digital output data items from the digital input data on the basis of a predetermined algorithm to determine an initial cell and a final cell in the array arrangement, between which there are situated cells with energy sources to be activated; a decoder device for decoding the at least two digital output data items from the DEM device into actuation signals in order to activate the cells which are to be activated; and an array arrangement of cells for outputting at least one quantized analog signal on the basis of the actuation signals.

In line with one preferred development, the array arrangement has single cells with a respective current source.

In line with a further preferred development, the DEM logic device has a parallel input for supplying the digital input data, which have a predetermined bit length.

In line with a further preferred development, the output of the DEM logic device has two digital output data items, an arithmetic sign signal and a clock signal which are coupled to the decoder device.

In line with a further preferred development, the output of the decoder device has two row actuation signals and three column actuation signals and preferably two associated complementary row actuation signals and three complementary column actuation signals which are coupled to the array arrangement for the purpose of activating energy sources for predetermined cells.

In line with a further preferred development, the array arrangement has two mutually inverse quantized analog output signals.

In line with a further preferred development, the array arrangement has single cells with a respective local decoder device whose input respectively has two row actuation signals and three column actuation signals and preferably two associated complementary row actuation signals and three complementary column actuation signals.

In line with a further preferred development, the array arrangement has a respective edge length of at least 64 cells, corresponding to a bit length for the input signal of at least 12 bits.

In line with a further preferred development, an initial cell and a final cell in the array arrangement, between which there are situated cells with activated energy sources, are determined in the DEM device from the digital input data on the basis of a predetermined algorithm, and particularly when the activated cells reach the last cell in the array arrangement cells are activated in a manner adjoining the first cell in the array arrangement.

In line with a further preferred development, a DWA (Data Weighted Averaging) algorithm or a bi-DWA (bidirectional Data Weighted Averaging) algorithm or an ILA (Individual Level Averaging) algorithm is used in the DEM device in order to determine the cells in the array arrangement which are to be activated.

In line with a further preferred development, a local decoder device in a cell in the array arrangement connects an energy source in the cell to an output of the decoder device when a first column signal and a first row signal, or a second column signal and a second row signal, or a third column signal are activated.

BRIEF DESCRIPTION OF THE DRAWINGS

An exemplary embodiment of the invention is shown in the drawings and is explained in more detail in the description below, in which:

FIG. 5 shows a schematic cell array arrangement to explain a detail of a known D/A converter.

DETAILED DESCRIPTION

In the figures, identical reference symbols denote components which are the same or have the same function.

Figure 1:
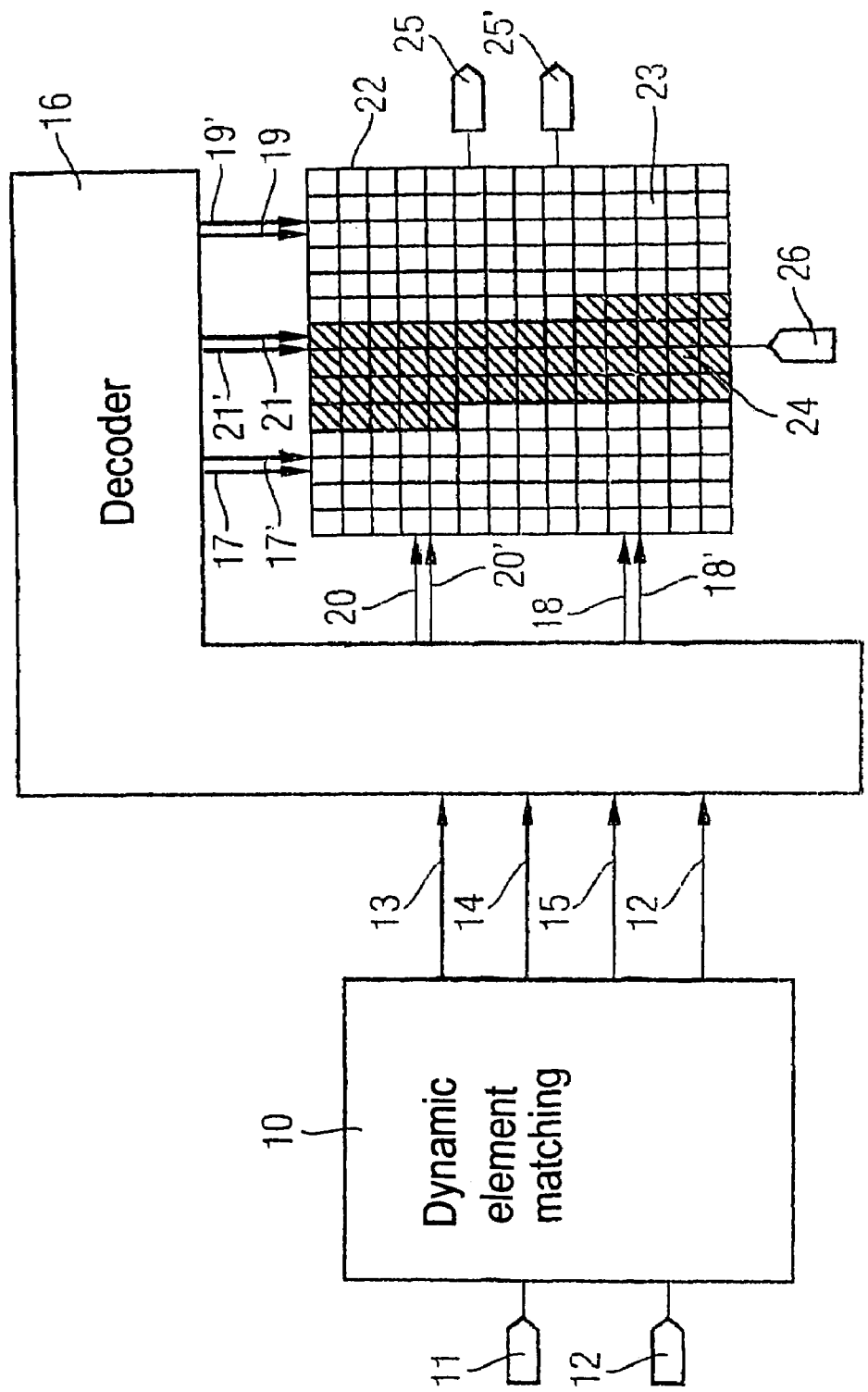
FIG. 1 shows a schematic block diagram of a D/A converter to explain an embodiment of the present invention.

FIG. 1 shows a schematic block diagram of an inventive D/A converter which has a DEM (Dynamic Element Matching) logic device 10. The DEM logic device 10 is supplied with digital data 11 via an input.

Preferably, the input used in this context is a parallel input which, by way of example, has with 12 lines when a supplied digital data item has a bit length of 12 bits. A clock signal 12 is likewise coupled to the DEM logic device 10. In the DEM logic device 10, two digital output data items 13, 14 and an arithmetic sign signal 15 are generated on the basis of the digital signal 11 applied to the input using a predetermined algorithm which is described below. The first digital output signal 13 from the DEM logic device 10 defines an initial cell and the second digital output signal 14 defines a final cell between which there are situated activated cells 24 (described below). Both the first digital output signal 13 and the second digital output signal 14 are supplied to a decoder device 16, for example via 12 respective lines (bit length of 12 bits). In addition, the decoder device 16 also receives the clock signal 12 and the arithmetic sign signal 15 from the logic device 10.

In the decoder device 16, the two digital output signals 13, 14 from the DEM logic device 10 and the arithmetic sign signal 15 are converted into actuation signals 17, 18, 19, 20, 21 for an array arrangement 22 of individual cells 23. The actuation signals 17, 18, 19, 20, 21 are preferably structured as follows in order to activate a predetermined number of cells 23 in the array arrangement 22: a first column actuation signal 17 stipulates, together with a first row actuation signal 18, that cell 23 in the array arrangement 22 from which activated cells 24 need to start. A second column actuation signal 19 and a second row actuation signal 20 serve to stipulate the number of activated cells 24 in the last column of the array arrangement 22, which activated cells 24 need to have in order to generate a quantized output signal level 25 through activation of a predetermined intermediate number of cells. The column actuation signal 21 stipulates the completely activated columns of the array arrangement 22 for generating the quantized output signal 25.

In line with the embodiment shown in FIG. 1, besides the actuation signals 17, 18, 19, 20, 21 there are also associated corresponding inverse actuation signals 17', 18', 19', 20', 21'. The array arrangement 22 is preferably connected to a reference current signal 26 which has the same level as the maximum output signal 25, i.e. all of the cells in the array arrangement 22 are activated cells 24. A second output signal 25' having the difference from the reference current level 26 with respect to the quantized output signal 25 is preferably additionally provided.

Figure 2:
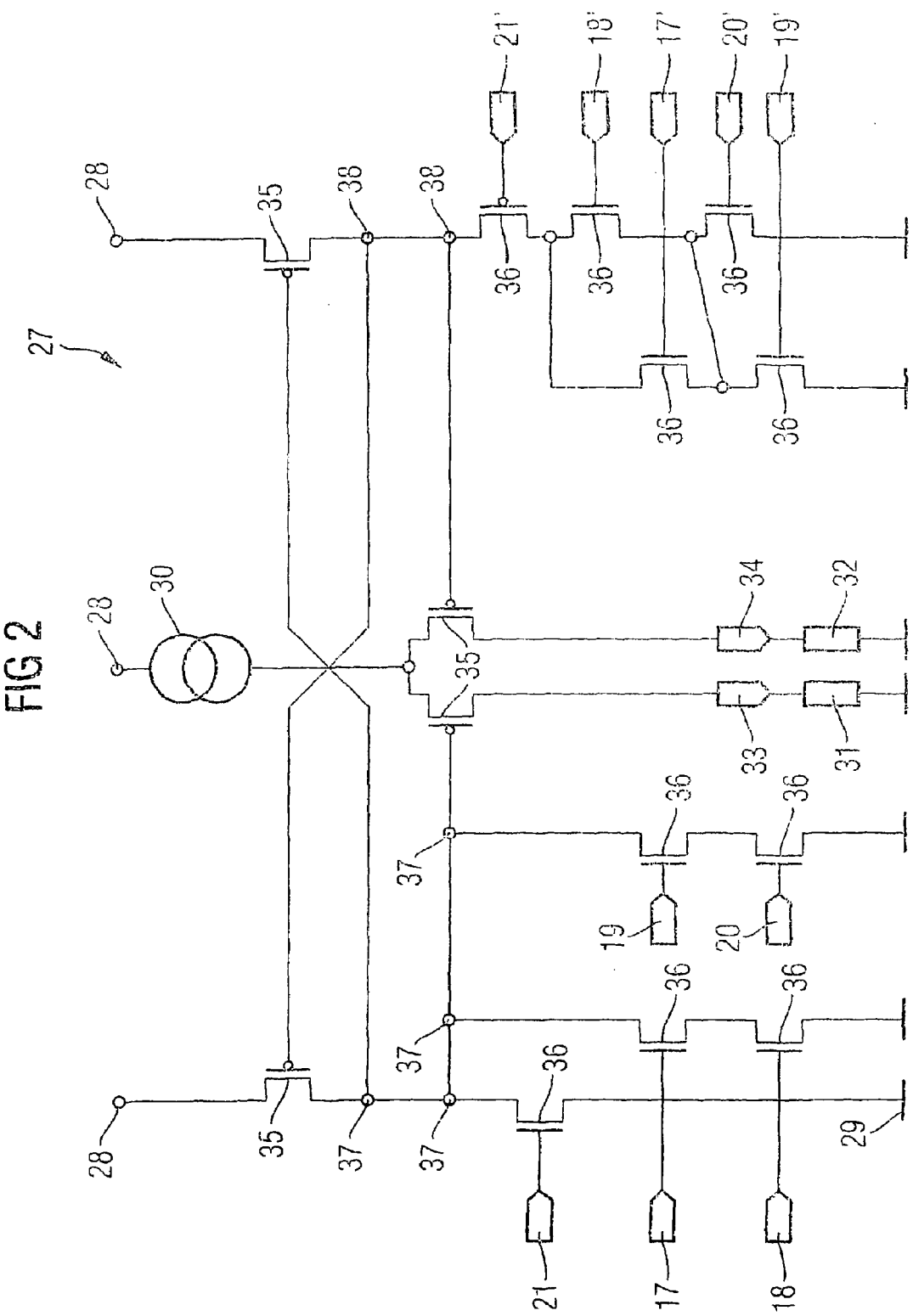
FIG. 2 shows a schematic circuit diagram to explain a detail of an embodiment of the present invention.

FIG. 2 schematically shows a circuit diagram to explain an exemplary design for an individual cell 23 in the array arrangement 22. The local decoder device 27 explained with reference to FIG. 2 has a potential source 28 which provides 2.5 V relative to a reference-ground potential 29, for example. A current source 30 as exemplary energy source 30 delivers a constant predetermined current which flows via a first resistor 31 or a second resistor 32 as a current contribution 33 to the output signal 25 shown in FIG. 1 or as a current contribution 34 to the output signal 25' on the basis of the actuation signals 17, 17', 18, 18', 19, 19', 20, 20', 21, 21'. For the circuit of the decoder device 27, p-channel FETs 35 and n-channel FETs 36 are preferably used whose gates are actuated by means of the actuation signals 17 to 21'.

The local decoder device 27 shown in FIG. 2 represents, by way of example, the logic function that the current contribution 33 flows through the first resistor 31 as a contribution from an activated single cell 24 to the output current 25 shown in FIG. 1 when either the column actuation signal 21 or the first column actuation signal and the first row actuation signal 17, 18 are activated simultaneously or the second column signal 19 and the second row signal 20 are activated simultaneously, i.e. have a high level. The output signal 25 adds the current contributions 33 from the activated cells 24. If the column actuation signal 21 applied is a high level, the potential at a logic point 37 is placed at the reference-ground potential 29, as a result of which the p-channel FET 35 in the left-hand phase between the current source 30 and the first resistor 31 is turned on. Consequently, the current contribution 33 flows in the left-hand phase. A similar situation arises when a high level is applied as column actuation signal 17 and simultaneously as row actuation signal 18. The same result is produced when the second column actuation signal 19 and at the same time the second row actuation signal 20 have a high level.

The actuation signals 17 to 21 and the associated inverted actuation signals 17' to 21' are used, so that capacitively coupled interference from these signals on the analog current contributions 33, 34 or the quantized output currents 25, 25' shown in FIG. 1 is, to a first approximation, eliminated. The local decoder 27 shown in FIG. 2 can be used to handle higher voltages 28 on the current sources 30 of each individual cell 23 in the array arrangement 22. The differential decoder 27 shown in FIG. 2 may also be provided with a clock synchronization block (not shown), for example.

Figure 3A:
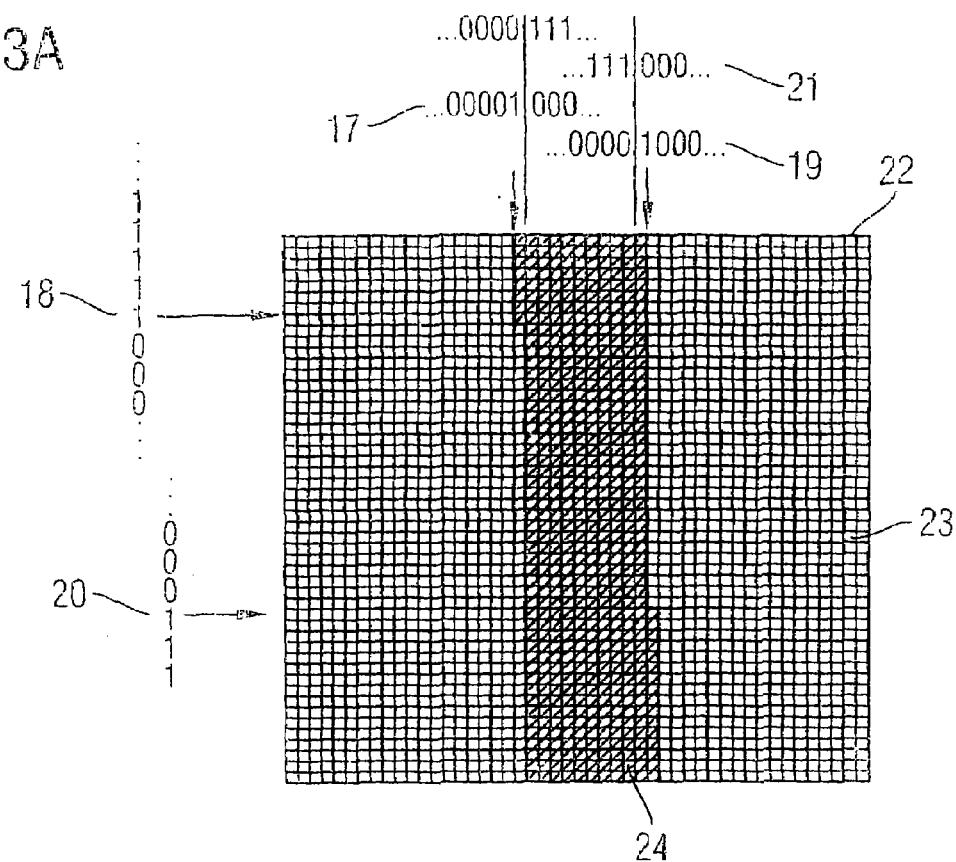
FIGS. 3A, B show a schematic diagram of a detail of a D/A converter to explain the way in which the present invention works, with the illustrated states differing in the arithmetic sign signal.
Figure 3B:
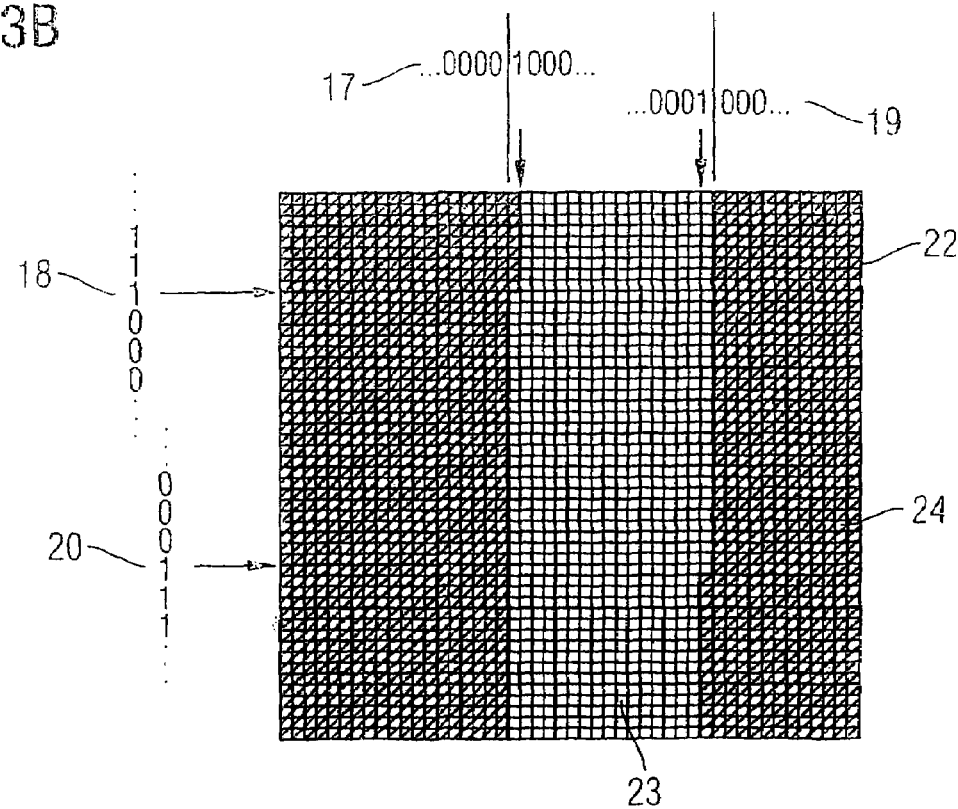

Reference is made to FIGS. 3A and 3B to give a schematic explanation of the actuation of cells 23 in the array arrangement 22. The first column actuation signal 17 is designed in the manner of a vector which has the length of one matrix side of the array arrangement 22. Only the column containing the initial value of the activated cells 24 contains a one, otherwise zeroes. A similar situation applies to the second column actuation signal 19, which, as a vector, has only a one in the column containing the last of the activated cells 24. The column signal 21 is represented by a vector which has a one for each fully activated column, otherwise zeroes.

The first row actuation signal 18 is represented by a vector which has ones from the first activated cell 24 onward and is provided with zeroes before that. The second row actuation signal 20 is a vector which has a one up to the last of the activated cells 24 but is subsequently provided with zeroes. In this way, appropriate levels as shown in FIG. 2 are applied to the cells 23 of the array arrangement 22, as a result of which a block of active cells 24 as shown in FIG. 3A is generated. Each active cell 24 has a predetermined output level (a predetermined current level in line with the present embodiment), and consequently the quantized output signal 25 obtained in line with FIG. 1 is a current value which corresponds to the number of activated cells 24 times the predetermined current contribution level 33 shown in FIG. 2. In this case, the arithmetic sign signal 15 shown in FIG. 1 is provided with a low level, i.e. zero, in FIG. 3. This means that no carry or continuation of turned-on cells 24 in an activated block which requires activated single cells 24 beyond the last cell of the array arrangement 22, and hence is continued at the first cell of the array arrangement 22 in line with FIG. 3B.

In the example shown in FIG. 3B, the cells, starting at an activated cell in the right-hand block of activated cells 24, are not sufficient to provide an output signal 25 having an appropriately high level in line with the digital input signal 11 shown in FIG. 1, and hence the block is continued starting at the first cell of the array arrangement 22 at the top left (left-hand block of activated cells 24 in FIG. 3B). In this context, the arithmetic sign signal has a high level, i.e. one. This ensures that despite the setting or displacement of the block of activated cells 24, following a DEM algorithm, the full reproduction range, i.e. the full number of quantization levels, i.e. the total number of cells in the array arrangement 22 (columns times rows), is available. In line with the present example, it is assumed that the cell at the top left is the first cell in the array arrangement 22 and the cell at the bottom right is accordingly the last cell in the array arrangement 22.

FIGS. 4A to 4D show time diagrams to explain various algorithms which can be applied in the DEM logic device 10. In this case, a value which can be quantized into eight quantization levels is reproduced per time cycle. In this case, by way of example, there is thus just one row for conversion, i.e. each row shows a new sampling time, in contrast to FIG. 1 and FIGS. 3A, B, in which a sampling time is always shown for a two-dimensional cell array 22.

Figure 4A:
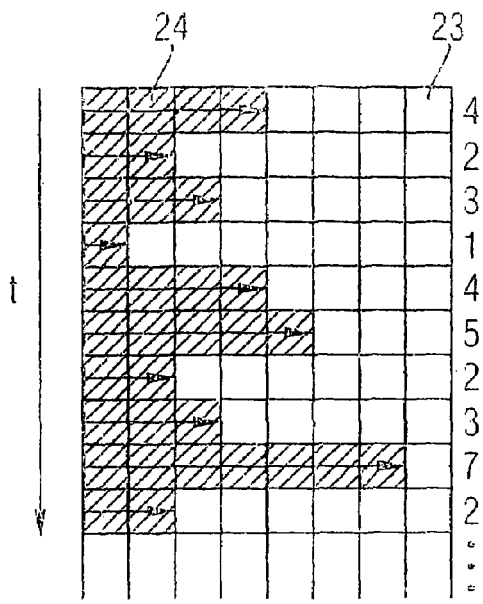
FIGS. 4A-D each show a schematic diagram to explain different algorithms.

FIG. 4A merely shows simple thermometer coding without DEM. The number behind a row represents a quantized value in all of the depictions 4A to 4D.

Without DEM, an output signal level (number of solid black boxes) comprising activated cells 24 is always shown starting at the first box on the left-hand side. That is to say that the left-hand box is activated much more frequently than the box on the outside right.

In the diagram shown in FIG. 4, the same numerical sequence (4, 2, 3, 1, 4, 5, 2, 3, 7, 2, . . . ) as in FIG. 4A is shown by activated boxes 24 at consecutive sampling times over time t, with coding in line with an ILA (Individual Level Averaging) algorithm being used.

This rotatory approach positions a block of active cells 24 in the other direction at the end of the previous block at each new break time, i.e. in line with the illustration in each new row.

Figure 4C:
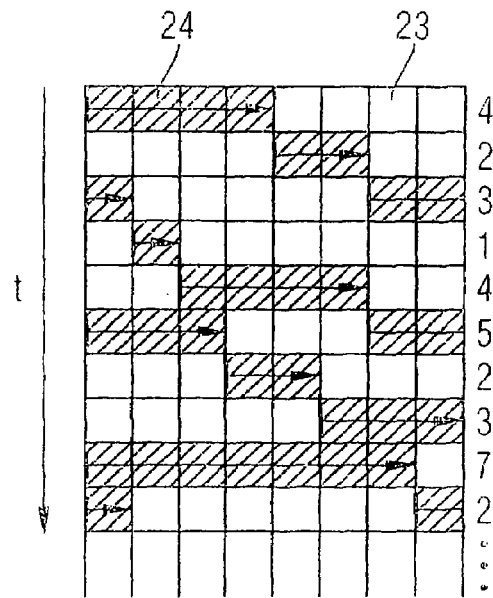
Figure 4B:
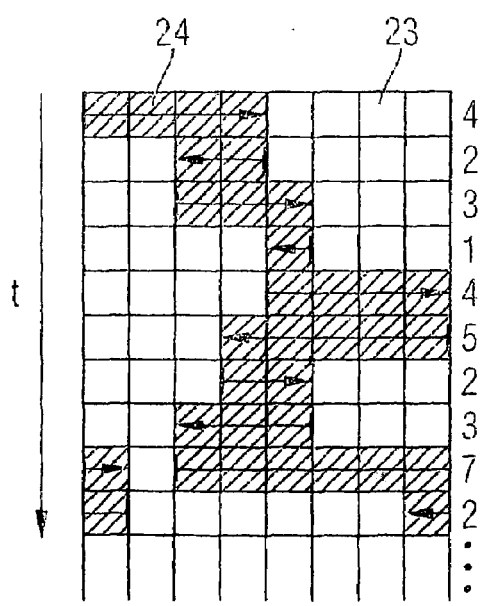

In the case of a DWA (Data Weighted Averaging) algorithm as shown in FIG. 4C, a new block of active cells 24 is always appended continuing in the same direction at the end of the previous block. When the end of the row is reached (in this case see third row) the quantized value is reproduced continuing at the front of the row.

Figure 4D:
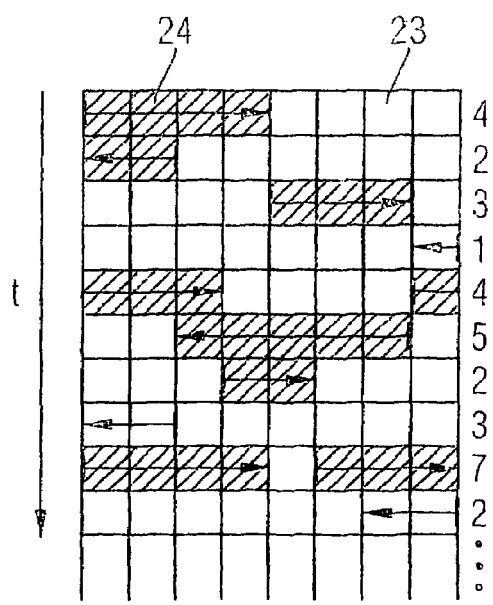

The diagram shown in FIG. 4D illustrates an example of a bi-DWA (bidirectional Data Weighted Averaging) algorithm, with the quantized values being reproduced in the uneven rows so as to attach activated cells 24 in a direction at the end of the block of activated cells 24 in the last but one row. In the second, fourth, sixth, . . . rows, the blocks of activated rows 24 are accordingly always appended in the opposite direction.

These and further algorithms can be used in the DEM logic device 10 in order to attach blocks of activated cells 24 also in a two-dimensional array arrangement 22 as shown in FIG. 1 with each new clock signal at the end of the block of activated cells from the previous sampling time.

Although the present invention has been described above with reference to preferred exemplary embodiments, it is not limited thereto but rather may be modified in a wide variety of ways. Although explained with reference to an input bit length of 12 bits, i.e. 4096 quantization levels, and an array arrangement 22 containing 64 rows and 64 columns (shown smaller in FIGS. 1 and 3), the apparatus or the method may also use any smaller or larger array arrangements 22 for quantized conversion into an analog signal.

Instead of using current sources as energy sources 30 as shown in FIG. 2, it is in principle also possible to provide a voltage source having a predetermined output voltage in each cell, the output signal 25 generated by the array arrangement 22 shown in FIG. 1, particularly by connecting the voltage levels of the activated single cells 24 in series, being the output signal 25. In addition, the design of a cell as shown in FIG. 2 with the decoder device 27 is an example and may also be configured in a different way while providing the same logic function.

LIST OF REFERENCE SYMBOLS

10 DEM (dynamic element matching) logic device
11 Digital input data, preferably parallel with 12 bits
12 Clock signal
13 Digital output signal (initial cell)
14 Digital output signal (final cell)
15 Arithmetic sign signal
16 Decoder device
17 First actuation signal, column
17' Inverted first actuation signal, column
18 First actuation signal, row
18' Inverted first actuation signal, row
19 Second actuation signal, column
19' Inverted second actuation signal, column
20 Second actuation signal, row
20' Inverted second actuation signal, row
21 Actuation signal, full columns
21' Inverted actuation signal, full columns
22 Array arrangement
23 Single cell in the array arrangement 24 Activated cell
25 Quantized output signal
25' Inverted quantized output signal
26 Reference current signal
27 Local decoder device
28 Potential source
29 Reference-ground potential
30 Energy source, preferably current source
31 Resistor
32 Resistor
33 Current contribution
34 Current contribution
35 P-channel FET
36 N-channel FET
37 Node
38 Node

The invention claimed is:

1. A digital-analog converter having:
   a) an array arrangement having a number of cells between a first and a last cell configured to output at least one quantized analog signal, the cells having a local decoder device configured to receive two row actuation signals and three column actuation signals;
   b) a dynamic element matching (DEM) logic device configured to generate at least one arithmetic sign signal and two digital output data items from digital input data on the basis of a predetermined DEM algorithm in order to determine an initial cell and a final cell in the array arrangement having energy sources which are to be activated, the at least one arithmetic sign signal determining whether cells adjoining the first cell in the array arrangement are activated if the cells to be activated reach the last cell in the array arrangement; and
   c) a decoder device configured to decode the at least one arithmetic sign signal and two digital output data items from the DEM device into the two row actuation signals and three column actuation signals, which are coupled to the array arrangement for the purpose of activating energy sources for the cells which are to be activated.

2. The digital-analog converter as claimed in claim 1, wherein the array arrangement has single cells with a respective current source as the energy source.

3. The digital-analog converter as claimed in claim 1, wherein the DEM logic device has a parallel input for supply the digital input data, which has a predetermined bit length.

4. The digital-analog converter as claimed in claim 1, wherein the decoder device is further configured to generate two complementary row actuation signals and three complementary column actuation signals which are coupled to the array arrangement for the purpose of activating energy sources for predetermined cells.

5. The digital-analog converter as claimed in claim 1, wherein the array arrangement is configured to generate two mutually inverse quantized analog output signals.

6. The digital-analog converter as claimed in claim 1, wherein an input of a respective local decoder device is adapted to receive two complementary row actuation signals and three complementary column actuation signals.

7. The digital-analog converter as claimed in claim 1, wherein the local decoder device respectively connects an energy source to a resistor when a first column signal and a first row signal, or second column signal and a second row signal, or a third column signal, are activated.

8. The digital-analog converter as claimed in claim 1, wherein the array arrangement has a respective edge length of at least 64 cells corresponding to a bit length for the input signal of at least 12 bits.

9. The digital-analog converter as claimed in claim 1, wherein the DEM logic device is configured to generate the at least one arithmetic sign signal and two digital output items on the basis of one of a group of DEM algorithms comprising a data weighted averaging algorithm, a bidirectional data weighted averaging algorithm, and an individual level averaging algorithm.

10. A digital-analog converter having:
    a) an array arrangement having a number of cells between a first and a last cell configured to output at least one quantized analog signal, the cells having a local decoder device configured to receive row actuation signals and column actuation signals;
    b) a dynamic element matching (DEM) logic device configured to generate at least one arithmetic sign signal and two digital output data items from digital input data on the basis of a predetermined DEM algorithm in order to determine an initial cell and a final cell in the array arrangement having energy sources which are to be activated, the at least one arithmetic sign signal determining whether cells adjoining the first cell in the array cells are activated if the cells to be activated reach the last cell in the array arrangement; and
    c) a decoder device configured to decode the at least one arithmetic sign signal and two digital output data items from the DEM device into the row actuation signals and column actuation signals, which are coupled to the array arrangement for the purpose of activating energy sources for the cells which are to be activated.

11. The digital-analog converter as claimed in claim 10, wherein the array arrangement has single cells with a respective current source as the energy source.

12. The digital-analog converter as claimed in claim 10, wherein the decoder device is further configured to generate complementary row actuation signals and complementary column actuation signals which are coupled to the array arrangement for the purpose of activating energy sources for predetermined cells.

13. The digital-analog converter as claimed in claim 10, wherein the array arrangement is configured to generate two mutually inverse quantized analog output signals.

14. The digital-analog converter as claimed in claim 10, wherein an input of a respective local decoder device is adapted to receive complementary row actuation signals and complementary column actuation signals.

15. The digital-analog converter as claimed in claim 10, wherein the local decoder device respectively connects an energy source to a resistor responsive to a particular combination of a row actuation signal and a column actuation signal, or responsive to a particular column actuation signal independent of any row actuation signal.

16. The digital-analog converter as claimed in claim 10, wherein the DEM logic device is configured to generate the at least one arithmetic sign signal and two digital output items on the basis of one of a group of DEM algorithms comprising a data weighted averaging algorithm, a bidirectional data weighted averaging algorithm, and an individual level averaging algorithm.

17. A digital-analog converter having:
    a) an array arrangement having a number of cells between a first and a last cell configured to output at least one quantized analog signal, the cells having a local decoder device configured to receive row actuation signals and column actuation signals; and b) a control circuit configured to generate the row actuation signals and the colunm actuation signals, which are coupled to the array arrangement for the purpose of activating energy sources for the cells which are to be activated, the row actuation signals and the column actuation signals configured to cause the array arrangement to activate energy sources of a set of cells defined by an initial cell and a final cell, the initial cell and final cell determined on the basis of a predetermined dynamic element matching (DEM) algorithm.

18. The digital-analog converter as claimed in claim 17, wherein the local decoder circuit is configured to receive two row activation signals and three column activation signals.

19. The digital-analog converter as claimed in claim 18, wherein the control circuit comprises a logic device and a decoder device, the logic device operable to generate two data items indicative of the initial cell and the final cell, and the decoder device operable to generate the two row activation signals and the three column activation signals based on at least the two data items.

20. The digital-analog converter as claimed in claim 17, wherein the control circuit is configured to determine the initial cell and the final cell on the basis of one of a group of DEM algorithms comprising a data weighted averaging algorithm, a bidirectional data weighted averaging algorithm, and an individual level averaging algorithm.

* * * * *